(12) United States Patent
Vandenberg et al.

(10) Patent No.: US 7,675,957 B2
(45) Date of Patent: Mar. 9, 2010

(54) LASER AND MONITORING PHOTODETECTOR WITH POLYMER LIGHT GUIDE

(75) Inventors: Joseph J. Vandenberg, West Covina, CA (US); Norman S. Kwong, San Marino, CA (US); Alex A. Behfar, Irvine, CA (US)

(73) Assignee: Binoptics Corporation, Ithaca, NY (US)

( * ) Notice: Subject to any disclaimer, the term of this patent is extended or adjusted under 35 U.S.C. 154(b) by 0 days.

(21) Appl. No.: 12/043,131

(22) Filed: Mar. 5, 2008

(65) Prior Publication Data

US 2008/0219316 A1    Sep. 11, 2008

Related U.S. Application Data

(60) Provisional application No. 60/904,805, filed on Mar. 5, 2007.

(51) Int. Cl.
*H01S 5/00* (2006.01)
*H01S 3/08* (2006.01)

(52) U.S. Cl. .............................. 372/50.21; 372/50.124; 372/108

(58) Field of Classification Search ............ 372/50.124, 372/50.21, 108
See application file for complete search history.

(56) References Cited

U.S. PATENT DOCUMENTS

| | | | |
|---|---|---|---|
| 6,392,256 B1 | 5/2002 | Scott et al. | |
| 6,837,627 B2* | 1/2005 | Nakanishi et al. | ............. 385/92 |
| 2004/0001675 A1* | 1/2004 | Haslett et al. | ................. 385/88 |
| 2005/0083982 A1 | 4/2005 | Behfar | |
| 2005/0123016 A1 | 6/2005 | Behfar et al. | |
| 2006/0118893 A1 | 6/2006 | Behfar et al. | |

* cited by examiner

*Primary Examiner*—Armando Rodriguez
(74) *Attorney, Agent, or Firm*—Jones, Tullar & Cooper, P.C.

(57) ABSTRACT

A surface emitting laser (100) and a monitoring photodetector (MPD) 158 are mounted in a TO (transistor outline package) can (150) on the same plane as one another. Light from a rear facet (108) of the laser is directed to the MPD through a polymer light guide (164).

20 Claims, 3 Drawing Sheets

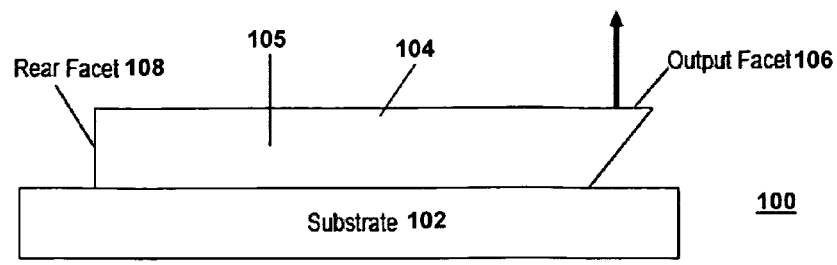
FIG. 2
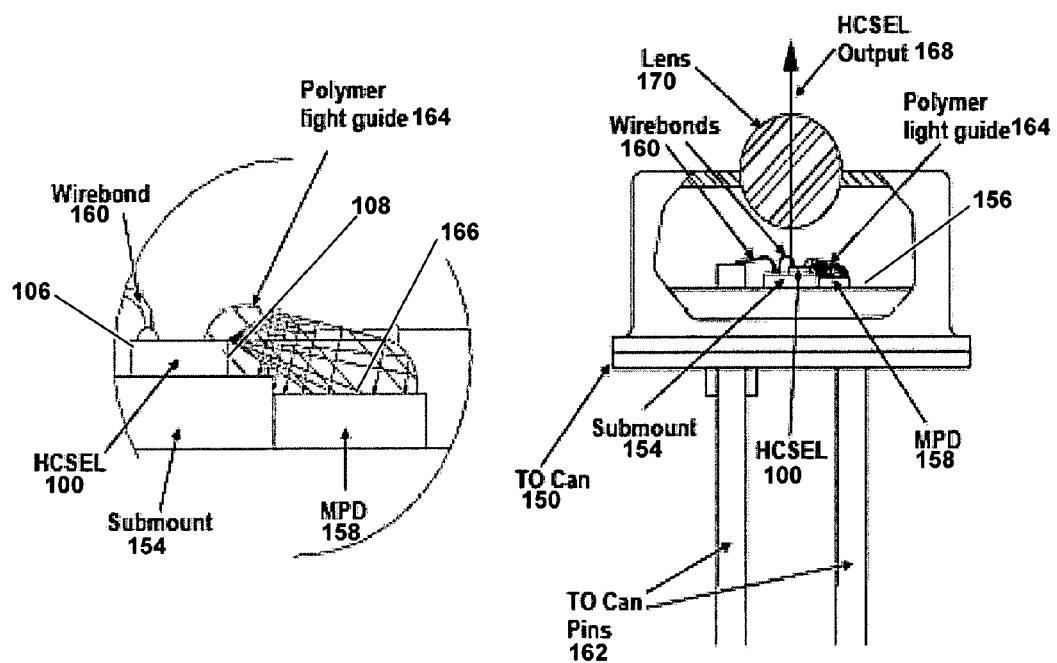
FIG. 3B  FIG. 3A

LASER AND MONITORING PHOTODETECTOR WITH POLYMER LIGHT GUIDE

CROSS REFERENCE TO RELATED APPLICATIONS

This application claims the benefit under 35 U.S.C 119(e) of U.S. Provisional Application No. 60/904,805, which was filed on Mar. 5, 2007 and is hereby incorporated by reference in its entirety.

BACKGROUND OF THE INVENTION

1. Field of the Invention

The present invention relates, in general, to the integration of a discrete semiconductor laser with a discrete monitoring photodetector (MPD), wherein light from the back facet of the semiconductor laser is guided to the MPD through a polymer light guide.

2. Description of the Background Art

Semiconductor lasers typically are fabricated by growing the appropriate layered semiconductor material on a substrate through Metalorganic Chemical Vapor Deposition (MOCVD) or Molecular Beam Epitaxy (MBE) to form an active layer parallel to the substrate surface. The material is then processed with a variety of semiconductor processing tools to produce a laser optical cavity incorporating the active layer, and metallic contacts are attached to the semiconductor material. Finally, laser mirror facets typically are formed at the ends of the laser cavity by cleaving the semiconductor material to define edges or ends of the laser optical cavity so that when a bias voltage is applied across the contacts the resulting current flow through the active layer causes photons to be emitted out of the faceted edges of the active layer in a direction perpendicular to the current flow.

The prior art discloses processes for forming the mirror facets of semiconductor lasers through etching, allowing lasers to be monolithically integrated with other photonic devices on the same substrate. The formation of total-internal-reflection facets within an optical cavity through the creation of such facets at angles greater than the critical angle for light propagating within the cavity is also known.

A new type of surface emitting semiconductor laser has been fabricated with etched mirrors or facets. This laser is known as a Horizontal Cavity Surface Emitting Laser (HCSEL) and is disclosed in US Patent Application Publication No. US 2005/0083982 A1, which was published Apr. 21, 2005 and in U.S. Pat. No. 7,245,645, issued Jul. 17, 2007, the disclosures of which is hereby incorporated herein by reference.

Packaging of a semiconductor edge-emitting laser (EEL) with an MPD requires the EEL to be mounted in a transistor outline package (TO) at an angle relative to the MPD, as shown in FIG. 1, which shows the inside of a TO can 10 with an EEL 12 and an MPD 14 mounted therein. In the illustration of FIG. 1, the EEL 12 is shown horizontally mounted on a submount 16. First, second and third TO can pins 18, 20 and 22 are provided which act as electrical connections to the EEL 12 and MPD 14. The MPD 14 is shown mounted vertically to the end of the center pin 20. A plurality of wirebonds 24 is provided to interconnect the EEL 12 and MPD 14 to the TO can pins 18 and 22 and to the can 10.

The rear facet of the EEL 12 is facing the MPD 14 so that the MPD 14 can monitor the light from that facet. Sometimes the MPD 14 is positioned slightly off from perpendicular to the incidence of the light beam from the rear facet to prevent back reflection into this facet. As illustrated, a three-dimensional packaging operation is thus required to form the package shown in FIG. 1, with chip mounting and wirebonding in two different planes of the package.

SUMMARY OF THE INVENTION

In accordance with the present invention, improved integration of a discrete semiconductor laser and a discrete monitoring photodetector (MPD) is accomplished by a simple two-dimensional packaging of a surface emitting laser with an MPD. The type of laser used in the present invention has its output facet at or near a 45° angle with respect to its substrate and its rear facet at or around 90° angle with respect to its substrate. Preferably, the laser is a Horizontal Cavity Surface Emitting Laser (HCSEL).

In the preferred embodiment, the HCSEL and the MPD are mounted on a single plane of a Transistor Outline (TO) package such that the horizontal cavity of the laser and a detector surface of the MPD are generally parallel to one another. The HCSEL is arranged with the rear facet thereof closer to the MPD than the output facet of the HCSEL. A polymer is deposited over the rear facet of the HCSEL and the MPD detector surface. This polymer is cured, creating a light guide. The light from the rear facet of the HCSEL is directed to the detector surface of the MPD through the light guide. This allows the MPD to monitor the light from the rear facet of the HCSEL.

BRIEF DESCRIPTION OF DRAWINGS

The foregoing and additional features and advantages of the present invention will be apparent to those of skill in the art from the following detailed description of preferred embodiments thereof, taken with the accompanying drawings, which are briefly described as a follows.

FIG. 2 is a schematic side view of the type of HCSEL used in the preferred embodiments of the present invention.

FIG. 3A is a schematic side view of an HCSEL and an MPD packaged in accordance with a preferred embodiment of the present invention. FIG. 3B is an enlargement of a portion of FIG. 3A.

DESCRIPTION OF THE INVENTION

Figure 1:
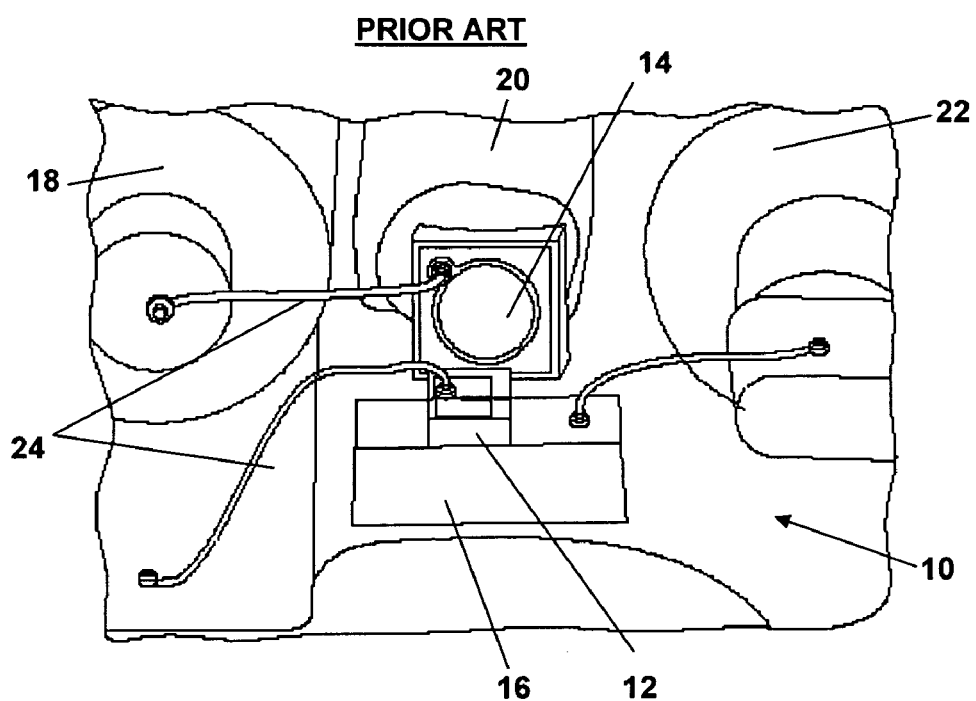
FIG. 1 is a schematic illustration of a prior art arrangement of a HCSEL and an MPD packaged in a TO can.

Turning now to a more detailed description of the invention, an improved integration of a discrete semiconductor laser and a discrete monitoring photodetector (MPD) is accomplished by a simple two-dimensional packaging of a surface emitting laser with an MPD. Preferably, the surface emitting laser is Horizontal Cavity Surface Emitting Laser (HCSEL).

FIG. 2 shows a HCSEL 100 of the type used in the preferred embodiments of the invention. The HCSEL 100 includes a substrate 102 on which is formed a laser structure 104 that includes a horizontal cavity 105. Located at one end of the cavity 105 is an output facet 106 that is positioned at or near a 45° angle with respect to the substrate 102. At the opposite end of the cavity 105 is located a rear facet 108 that is positioned at or near a 90° angle with respect to the substrate 102. This HCSEL 100 is taught in detail in the previously mentioned published patent application (US 2005/0083982 A1), specifically with respect to the device of FIG. 5 of that application.

FIG. 3A shows a TO can 150, such as a TO-46 commonly used for packaging a Vertical Cavity Surface Emitting Laser (VCSEL). Unlike the prior art TO 10 of FIG. 1 where the package has two different surfaces for the mounting of the laser and the MPD, the TO can 150 in FIG. 3 has only one, preferably planar, inner surface 152 for device mounting. The HCSEL 100 of FIG. 2 is mounted first on a submount 154 and then the submount 154 is mounted on the inner surface 152 of the TO can 150. An MPD 158 is mounted directly on the inner surface 152 also, near or adjacent the rear facet 108 of the HCSEL 100. Alternatively, the HCSEL 100 can be mounted directly to the inner surface 152 of the TO can 150 also, eliminating the submount 154.

Figure 4A:
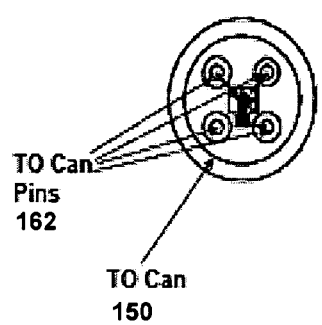
FIG. 4A is a schematic top view of the device shown in FIG. 3A.
Figure 4B:
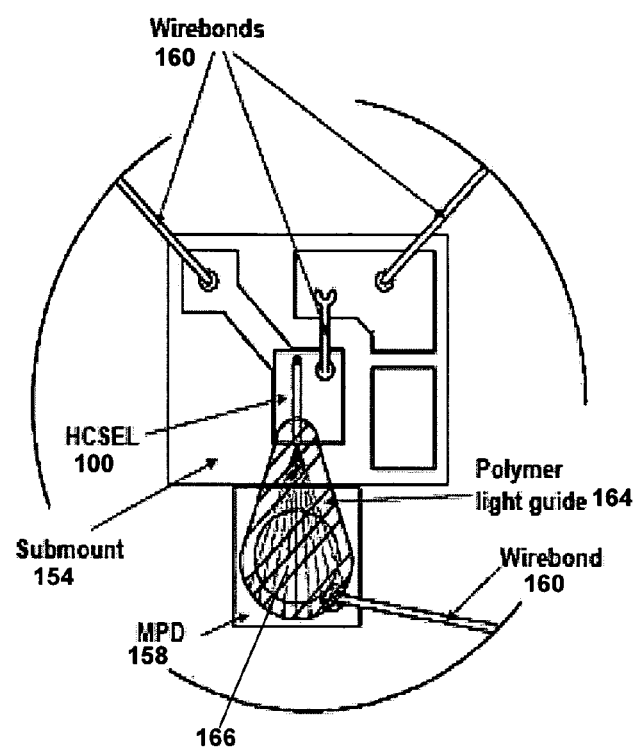
FIG. 4B is an enlargement of a portion of FIG. 4A.

The expanded view in FIG. 3B shows that the HCSEL 100 and the MPD 158 are mounted on a single plane of the TO can 150 with the rear facet 108 of the HCSEL 100 closer to the MPD 158 than the output facet 106 of the HCSEL 100. A plurality of wirebonds 160 is employed to electrically connect the HCSEL 100 and the MPD 158 to a plurality of TO can pins 162. The mounting and wirebonding of the two chips, the HCSEL 100 and MPD 158, schematically illustrated in FIGS. 3A, 3B and 4B, are thus done in the same surface and plane, which keeps the packaging two dimensional and straightforward. It also reduces the cost of packaging.

A light guide 164 is provided to direct light form the rear facet 108 of the HCSEL 100 to the MPD 158. Preferably, a polymer, such as epoxy, is deposited over the rear facet 108 of the HCSEL 100 and a detector surface 166 of the MPD 158 surface to form the light guide 164 as is shown in FIG. 3B. It is desirable to have a polymer that is low absorption at the wavelength of emission of the HCSEL 100. For example, for a 1310 nm emitting HCSEL and an InGaAs-based MPD, an epoxy with low absorption around the 1310 nm wavelength region would be employed. During fabrication of an actual working embodiment of the invention, the epoxy was deposited on the rear facet 108 of the HCSEL 100 and on the MPD 158 using a dispenser. The epoxy was then cured using ultraviolet (UV) light, thereby creating the light guide 164.

As illustrated in FIG. 3A, the light from the rear facet 108 of the HCSEL 100 is directed to the MPD 158 through the light guide 164. This allows the MPD 158 to monitor the light from the rear facet 108 of the HCSEL 100. The refractive index of the polymer used in the working embodiment was around 1.5, so most of the light was totally internally reflected at the polymer/air interface as shown in FIG. 3A, allowing the light guide 164 to direct a large portion of light from the rear facet 108 of the HCSEL 100 to the MPD 158. In hermetically sealed packages, air is usually replaced with another gas, but the refractive index of air and such a gas are very close, so the behavior of the light guide 164 is essentially unaffected.

The output facet 106 of the HCSEL 100 provides the laser output that typically goes through a lens 168 as shown in FIG. 3A. In an experiment on the working embodiment, measurement of the MPD current and the light output from the lens 168 gave good tracking performance.

A HCSEL cavity can be positioned in different ways within the HCSEL chip. For example, US 2005/0083982 A1, specifically with respect to the device of FIG. 14 of that application, teaches that a HCSEL cavity that is positioned so that none of the HCSEL chip sides are parallel to the HCSEL cavity. The present invention is compatible with such a HCSEL and in addition is compatible with a HCSEL chip where at least two of the chip sides are parallel to the HCSEL cavity.

U.S. Pat. No. 7,245,645 discloses a HCSEL with a lens, which can also be used in the present invention. Also, a HCSEL device can be designed to operate in different ways, for example as a Fabry-Perot laser or a Distributed Feedback laser. These can also be used with the preferred embodiments of the present invention.

Although the present invention has been illustrated in terms of preferred embodiments, it will be understood that numerous other variations and modifications may be made without departing from the scope of the invention as set forth in the following claims.

What is claimed is:

1. An electronic device comprising:
   a surface;
   a surface emitting laser mounted on said surface, said laser including an output facet and a rear facet;
   an MPD mounted on said surface, said MPD having a detector surface; and
   a polymer light guide deposited on said rear facet of said laser and interfaced to said MPD detector surface.

2. The device of claim 1, wherein said laser is a horizontal cavity surface emitting laser (HCSEL) and wherein said MPD is adjacent said rear facet of said laser.

3. The device of claim 1, wherein said laser is mounted on a submount.

4. The device of claim 1, wherein said output facet of said laser is directed towards a lens.

5. The device of claim 1, wherein said polymer is an epoxy.

6. The device of claim 5, wherein said epoxy is UV curable.

7. The device of claim 1, wherein said surface is mounted in a TO can.

8. The device of claim 1, wherein said surface is an inner surface of a TO can.

9. The device of claim 1, wherein said rear facet is disposed at an angle relative to said MPD detector surface.

10. The device of claim 9, wherein said laser is a horizontal cavity surface emitting laser (HCSEL) which includes a laser cavity that is parallel to said MPD detector surface.

11. The device of claim 1, wherein said polymer light guide includes an external surface which is positioned to reflect light emitted from said rear facet internally toward said MPD detector surface.

12. An electronic device comprising:
    a surface;
    a horizontal cavity surface emitting laser (HCSEL) mounted on said surface, said laser including a cavity, an output facet and a rear facet;
    an MPD mounted on said surface, said MPD having a detector surface that is parallel to said cavity of said HCSEL; and
    a polymer light guide deposited on said rear facet of said laser and interfaced to said MPD detector surface.

13. The device of claim 12, wherein said MPD is adjacent said rear facet of said laser.

14. The device of claim 13, wherein said rear facet is disposed at an angle relative to said MPD detector surface.

15. The device of claim 12 wherein said laser is mounted on a submount.

16. The device of claim 12, wherein said output facet of said laser is directed towards a lens.

17. The device of claim 12, wherein said polymer is an epoxy.

18. The device of claim 12, wherein said surface is mounted in a TO can.

19. The device of claim 12, wherein said surface is an inner surface of a TO can.

20. The device of claim 12, wherein said polymer light guide includes an external surface which is positioned to reflect light emitted from said rear facet internally toward said MPD detector surface.

* * * * *